United States Patent
Mast et al.

(10) Patent No.: US 12,253,582 B1
(45) Date of Patent: Mar. 18, 2025

(54) GAS LOADER CELL FOR SOLID-STATE NMR SPINNING OR STATIC ROTORS

(71) Applicant: University of South Florida, Tampa, FL (US)

(72) Inventors: Jason Mast, Plant City, FL (US); Edwin Rivera, Land O' Lakes, FL (US)

(73) Assignee: University of South Florida, Tampa, FL (US)

( * ) Notice: Subject to any disclaimer, the term of this patent is extended or adjusted under 35 U.S.C. 154(b) by 168 days.

(21) Appl. No.: 18/298,756

(22) Filed: Apr. 11, 2023

Related U.S. Application Data

(60) Provisional application No. 63/329,816, filed on Apr. 11, 2022.

(51) Int. Cl.
*G01R 33/30* (2006.01)

(52) U.S. Cl.
CPC .................. *G01R 33/307* (2013.01)

(58) Field of Classification Search
CPC .................................................. G01R 33/307
See application file for complete search history.

(56) References Cited

U.S. PATENT DOCUMENTS 4,275,350 A * 6/1981 Hill ...................... G01R 33/307
505/844

OTHER PUBLICATIONS

Chen, P-H et al. Two millimeter diameter spherical rotors spinning at 68 kHz for MAS NMR. Journal of Magnetic Resonance Open, 8-9 (2021) 100015.
Bruker Introduces Novel Solid-State NMR Probe with Ultra-high Spinning Frequency. Bruker Corporation. Apr. 20, 2015. https://ir.bruker.com/press-releases/press-release-details/2015/Bruker...Solid-State-NMR-Probe-with-Ultra-high-Spinning-Frequency/default.aspx accessed Nov. 5, 2021.
Struppe, J et al. Ultrafast 1H MAS NMR Crystallography for Natural Abundance Pharmaceutical Compounds. Mol Pharm. Feb. 3, 2020; 17(2): 674-682.
Koppe, J. et al. Frequency-Swept Ultra-Wideline Magic-Angle Spinning NMR Spectroscopy. The Journal of Physical Chemistry A. 2021, 125, 25, 5643-5649.
Osborn Popp, T. M. et al. Highly stable magic angle spinning spherical rotors. Magn. Reson., 1, 97-103, 2020.

* cited by examiner

*Primary Examiner* — G.M. A Hyder
(74) *Attorney, Agent, or Firm* — Owen G. Behrens; Smith & Hopen, P.A.

(57) ABSTRACT

Described herein relates to an apparatus and method for holding a solid state NMR rotor under vacuum gas exposure during ssMAS experiments. As such, in an embodiment, the novel gas loader cell apparatus may be miniaturized and/or formed from a material other than glass to provide ease of use, efficient use of gaseous materials, affordability, and portability. Additionally, in an embodiment, a novel forming tool may be used to form the cavity holding the rotor end cap.

20 Claims, 10 Drawing Sheets

GAS LOADER CELL FOR SOLID-STATE NMR SPINNING OR STATIC ROTORS

CROSS-REFERENCE TO RELATED APPLICATIONS

This nonprovisional application claims the benefit of U.S. Provisional Patent Application No. 63/329,816 entitled "GAS LOADER CELL FOR SOLID-STATE NMR SPINNING OR STATIC ROTORS" filed Apr. 11, 2022 by the same inventors, all of which is incorporated herein by reference, in its entirety, for all purposes.

FEDERALLY SPONSORED RESEARCH OR DEVELOPMENT

This invention was made with government support under Grant No. P01 2000007150 awarded by the National Academies of Science, Engineering, and Medicine. The Government has certain rights in the invention.

BACKGROUND OF THE INVENTION

1. Field of the Invention

This invention relates to gas loader cells. Specifically, the invention pertains to an apparatus and method for holding a solid state NMR rotor under vacuum gas exposure during ssMAS experiments.

2. Brief Description of the Prior Art

Presently, there are no commercially available gas rotor loader cell apparatus for solid-state NMR ultra-high spinning rotors used in solid-state Magic Angle Spinning (hereinafter "ssMAS") experiments. The gas loader cells available today for NMR rotors, instead, are required to be custom built in specific academic glassblower facilities by expert glassblowers. Moreover, the existing cells produced of glass are expensive and fragile, while the size needed for rotors to achieve ultra-high spinning speeds makes each design extremely unique and complex. Furthermore, as the glass is fragile, it is extremely difficult to transport the current gas rotor loader cell apparatuses, available today. As such, even those these glassblower facilities are critical for creating gas rotor loader cell apparatuses, because making a gas rotor loader cell apparatus can be an expensive and time-consuming process, institutions that can no longer afford the gas rotor loader cell apparatus are beginning to slowly phase out these glassblower facilities.

Accordingly, what is needed is safe, affordable, durable, portable, and efficient apparatus and method for holding a solid state NMR rotor under vacuum gas exposure during ssMAS experiments. However, in view of the art considered as a whole at the time the present invention was made, it was not obvious to those of ordinary skill in the field of this invention how the shortcomings of the prior art could be overcome.

SUMMARY OF THE INVENTION

The long-standing but heretofore unfulfilled need, stated above, is now met by a novel and non-obvious invention disclosed and claimed herein. In an aspect, the present disclosure pertains to a gas rotor loader cell apparatus. In an embodiment, the gas rotor loader cell apparatus may comprise the following, including but not limited to: (a) a base, the base comprising: (i) a mounting plate; (ii) an outer cylinder extending proximally from the mounting plate; (iii) a hose barb extending laterally from the outer cylinder; and (iv) a holding cylinder disposed within the outer cylinder, with the holding cylinder comprising: (1) a female coupling mechanism; and (2) a smooth section extending distally from the female coupling mechanism and terminating in a conical funnel; and (b) a plunger, the plunger comprising: (v) a proximal handle; (vi) a male coupling mechanism extending distally from the handle; (vii) a smooth section extending distally from the threaded section; (viii) at least one groove disposed about at least a portion of the smooth section, such that at least one O-ring may be configured to be disposed in the at least one groove; and (ix) a frustoconical end extending distally from the smooth section. In this embodiment, the plunger may be configured to be sized for seamless insertion into the holding cylinder of the base. In some embodiments, the apparatus may be formed from a material comprising transparent components and/or acrylic-like properties and/or polycarbonate-like properties.

In some embodiments, the frustoconical end may be hollow, such that the frustoconical end may comprise at least one cavity. In this manner, the at least one cavity of the frustoconical end may then be filled with at least one material comprising silicone-like properties. In addition, in these other embodiments, the at least one cavity may be disposed in a distal end of the frustoconical end, such that the frustoconical end may be configured to hold a rotor end cap.

In addition, in some embodiments, the male coupling mechanism of the plunger may be configured to couple to the female coupling mechanism of the base. Accordingly, in these other embodiments, when the male coupling mechanism of the plunger is temporarily affixed to the female coupling mechanism of the base, the at least one O-ring of the plunger may be configured to abut an inner wall of the holding cylinder, such that an airtight seal between the inner wall of the holding cylinder and the at least one O-ring may be formed.

Moreover, in some embodiments, the hose barb may further comprise at least one hose barb aperture extending between the inner wall of the holding cylinder and an outer surface of the hose barb. In this manner, the hose barb may be configured to temporarily affix to a vacuum line, such that at least one gas may be transmitted from the vacuum line and/or disposed within the holding cylinder of the base, via the at least one hose barb aperture.

In some embodiments, a rotor may also be disposed about a base of the holding cylinder, such that a top surface of the rotor may be open-ended. In these other embodiments, when the male coupling mechanism of the plunger is temporarily affixed to the female coupling mechanism of the base, the rotor end cap may be configured to temporarily abut seamlessly with the top surface of the rotor, such that at least a portion of the at least one gas within the rotor is retained.

Additionally, in another aspect, the present disclosure pertains to a method of manufacturing a gas rotor loader cell apparatus. In an embodiment, the method may comprise the following: (a) providing at least one material, the at least one material comprising at acrylic-like properties and/or polycarbonate-like properties; (b) fabricating, via a computer device comprising at least one processor in electrical communication with at least one fabricating device, a base, a plunger, and/or a fabricating tool, such that a distal end of a frustoconical end of the plunger may comprise at least one cavity; (c) disposing at least one alternative material comprising silicone-like properties into the at least one cavity of the frustoconical end of the plunge; and (d) molding, via the forming tool, the filled cavity, such that the filled cavity may be complimentary to a rotor end cap, allowing the frustoconical end to hold the rotor end cap. In this embodiment, the at least one fabricating device may comprise at least one 3D printer, and/or the at least one material comprising silicone-like properties may be pre-cured.

Additionally, in some embodiments, the method may further comprise the step of, creating, via a design software, at least one design of the base, the plunger, and/or the forming tool compatible to the at least one fabricating device, such that the processor may be configured to transmit the at least one design to the at least one fabricating device. In these other embodiments, the method may also further comprise the step of, attaching the forming tool to the frustoconical end of the plunger, such that the forming tool may comprise at least one projection extending distally from a circular base, allowing the at least one projection to attach to at least one outer wall of the frustoconical end of the plunger. Furthermore, the method may comprise the step of, disposing the rotor end cap on a molded distal side of the frustoconical end of the plunger, such that the molded distal end of the frustoconical end and the rotor end cap may comprise a coefficient of friction greater than gravity.

Furthermore, in another aspect, the present disclosure pertains to a gas rotor loader cell system for ssMAS experiments. In an embodiment, the gas rotor loader cell system may comprise the following: (a) a base, the base comprising: (i) a mounting plate; (ii) an outer cylinder extending proximally from the mounting plate; (iii) a hose barb extending laterally from the outer cylinder; and (iv) a holding cylinder disposed within the outer cylinder, with the holding cylinder comprising: (1) a female coupling mechanism; and (2) a smooth section extending distally from the female coupling mechanism and terminating in a conical funnel; (b) a plunger, the plunger comprising: (v) a proximal handle; (vi) a male coupling mechanism extending distally from the handle; (vii) a smooth section extending distally from the threaded section; (viii) at least one groove disposed about at least a portion of the smooth section, wherein at least one O-ring is configured to be disposed in the at least one groove; and (ix) a frustoconical end extending distally from the smooth section; and (c) a forming tool, the forming tool comprising: (x) a circular base; (xi) at least one projection, such that the at least one projection may be configured to extend distally from the circular base; (xii) a center mold; and (xiii) at least one gutter. In this embodiment, the plunger may be sized for seamless insertion into the holding cylinder of base.

In some embodiments, the center mold may be shaped to complimentary correspond to a shape of a rotor end cap. As such, in these other embodiments, the at least one gutter may be configured to be disposed on at least one side of the center mold, such that the at least one gutter may be positioned on at least a portion of the forming tool. In this manner, while during a molding process, the at least one gutter may create at least one divot within an outer surface of the frustoconical end of the plunger, such that air behind rotor end cap may be allowed to escape when the rotor end cap is held by the frustoconical end of the plunger.

Additionally, in some embodiments, the gas rotor loader cell apparatus may be configured to allow a solid-state NMR rotor to be held under a vacuum and/or be exposed to at least one isotopically labeled gas while insertion of the rotor end cap may be configured to retain the at least one gas within the rotor in order to keep the sample material exposed to the gas. Additionally, in some embodiments, the gas rotor loader cell apparatus may comprise a small volume, as compared to the gas rotor loader cell apparatuses known in the art. As such, in these other embodiments, the gas rotor loader cell apparatus of the present disclosure may comprise few parts, such that at least one operator may be able to easily handle and/or transport the gas rotor loader cell apparatus from an origin destination to at least one end destination without difficulty. Moreover, in these other embodiments, the gas rotor loader cell apparatus may be 3D printed, such that the gas rotor loader cell apparatus may be readily duplicated and/or produced.

In this manner, by minimizing the volume of the internal plumbing, the gas rotor loader cell apparatus may ensure that expensive gases are not wasted while using few parts assists in minimizing gas and/or vacuum leakage and/or may avoid the at least one rotor becoming jammed as is present in existing glass cells. In some embodiments, the device may be configured to be made from at least one transparent material, such that the at least one operator may view the process occurring in the gas rotor loader cell apparatus.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not restrictive.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which:

FIG. 1A is a transparent side view of the gas loader cell with a first rotor. FIG. 1B is a transparent side view of a gas rotor loader cell with a second rotor, according to an embodiment of the present disclosure.

DETAILED DESCRIPTION OF THE INVENTION

Figure 1A:
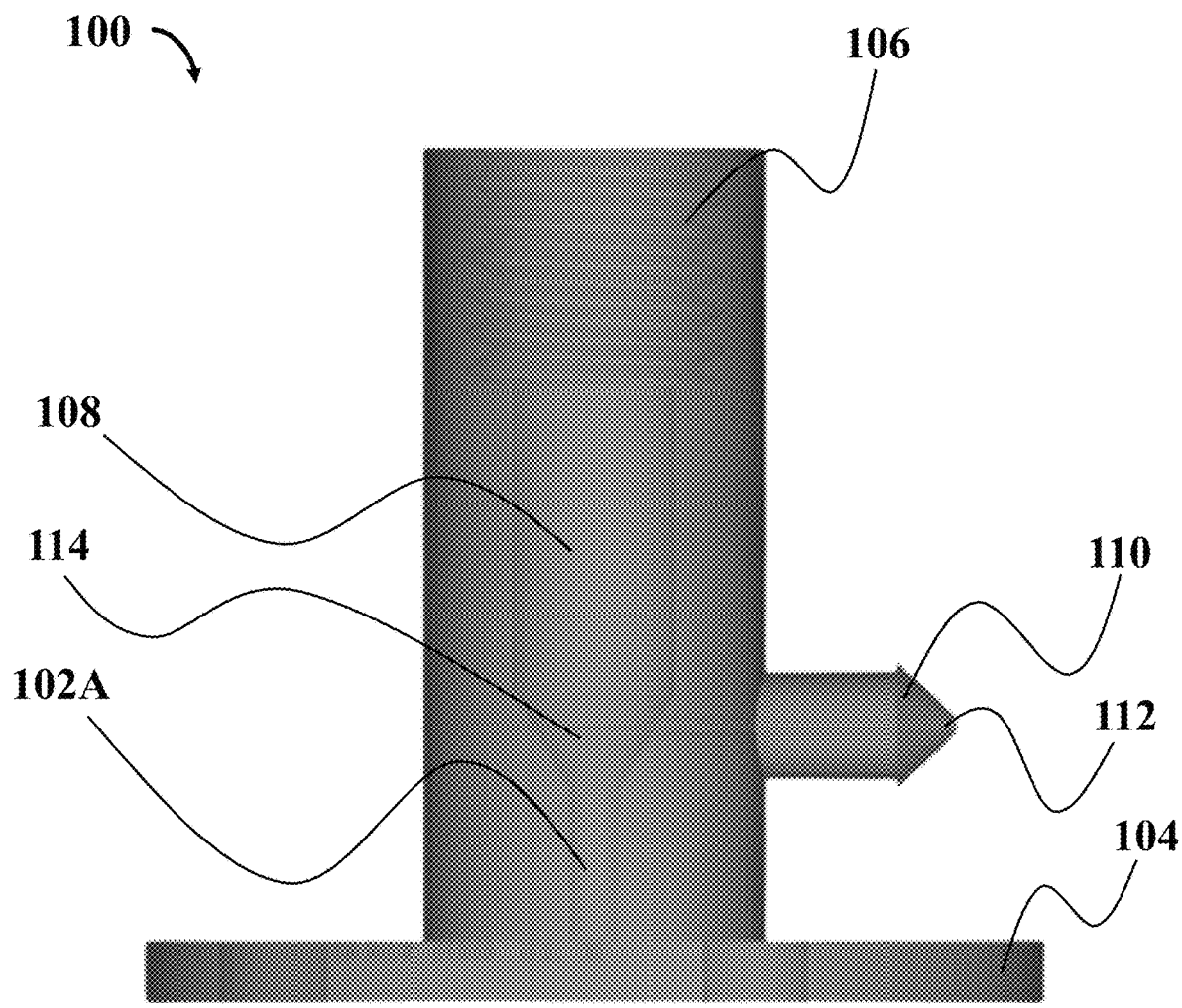
FIGS. 1A-1B are transparent side views of a gas rotor loader cell apparatus, according to an embodiment of the present disclosure.

In the following detailed description of the preferred embodiments, reference is made to the accompanying drawings, which form a part thereof, and within which are shown by way of illustration specific embodiments by which the invention may be practiced. It is to be understood that one skilled in the art will recognize that other embodiments may be utilized, and it will be apparent to one skilled in the art that structural changes may be made without departing from the scope of the invention. Elements/components shown in diagrams are illustrative of exemplary embodiments of the disclosure and are meant to avoid obscuring the disclosure. Any headings, used herein, are for organizational purposes only and shall not be used to limit the scope of the description or the claims. Furthermore, the use of certain terms in various places in the specification, described herein, are for illustration and should not be construed as limiting.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. The appearances of the phrases "in one embodiment," "in an embodiment," "in embodiments," "in alternative embodiments," "in an alternative embodiment," or "in some embodiments" in various places in the specification are not necessarily all referring to the same embodiment or embodiments. The terms "include," "including," "comprise," and "comprising" shall be understood to be open terms and any lists that follow are examples and not meant to be limited to the listed items.

Definitions

As used in this specification and the appended claims, the singular forms "a," "an," and "the" include plural referents unless the content clearly dictates otherwise. As used in this specification and the appended claims, the term "or" is generally employed in its sense including "and/or" unless the context clearly dictates otherwise.

In the following description, for the purposes of explanation, numerous specific details are set forth in order to provide a thorough understanding of embodiments of the present technology. It will be apparent, however, to one skilled in the art that embodiments of the present technology may be practiced without some of these specific details. The techniques introduced here can be embodied as special-purpose hardware (e.g. circuitry), as programmable circuitry appropriately programmed with software and/or firmware, or as a combination of special-purpose and programmable circuitry. Hence, embodiments may include a machine-readable medium having stored thereon instructions which may be used to program a computer (or other electronic devices) to perform a process. The machine-readable medium may include, but is not limited to, floppy diskettes, optical disks, compacts disc read-only memories (CD-ROMs), magneto-optical disks, ROMs, random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions.

As used herein, the term "attachment component" refers to any device known in the art which may be configured to temporarily affix at least two apparatuses to each other. The attachment component may be a nail, a screw, glue, a clamp and/or a rivet. For ease of reference, the exemplary embodiment, described herein, refers to a screw, but this description should not be interpreted as exclusionary of other attachment components.

As used herein, the term "ground platform" refers to any planar surface known in the art which may be used to perform laboratory actions. The ground platform may be a floor, a table, a 3D printer, and/or a fume hood. For ease of reference, the exemplary embodiment, described herein, refers to a fume hood, but this description should not be interpreted as exclusionary of other ground platforms.

As used herein, the term "fabricating device" refers to any machinery known in the art which may be used to create laboratory instruments. The fabricating device may be a 3D printer, a lathe, a milling machine, a welding machine, and/or a drill press. For ease of reference, the exemplary embodiment, described herein, refers to a 3D printer, but this description should not be interpreted as exclusionary of other fabricating devices.

As used herein, the term "silicone-like" refers to any material and/or physical and/or chemical properties known in the art which may comprise any physical and/or chemical characteristics known in the art identical in nature (i.e., equivalent to) and/or nearly identical in nature to silicone. For ease of reference, the exemplary embodiment, described herein, refers to silicone, but this description should not be interpreted as exclusionary of other silicone-like materials.

As used herein, the term "acrylic-like" refers to any material and/or physical and/or chemical properties known in the art which may comprise any physical and/or chemical characteristics known in the art identical in nature (i.e., equivalent to) and/or nearly identical in nature to acrylic. For ease of reference, the exemplary embodiment, described herein, refers to acrylic, but this description should not be interpreted as exclusionary of other acrylic-like materials.

As used herein, the term "polycarbonate-like" refers to any material and/or physical and/or chemical properties known in the art which may comprise any physical and/or chemical characteristics known in the art identical in nature (i.e., equivalent to) and/or nearly identical in nature to polycarbonate. For ease of reference, the exemplary embodiment, described herein, refers to polycarbonate, but this description should not be interpreted as exclusionary of other polycarbonate-like materials.

As used herein, "about" means approximately or nearly and in the context of a numerical value or range set forth means±15% of the numerical.

All numerical designations, including ranges, are approximations which are varied up or down by increments of 1.0, 0.1, 0.01 or 0.001 as appropriate. It is to be understood, even if it is not always explicitly stated, that all numerical designations are preceded by the term "about". It is also to be understood, even if it is not always explicitly stated, that the compounds and structures described herein are merely exemplary and that equivalents of such are known in the art and can be substituted for the compounds and structures explicitly stated herein.

Wherever the term "at least," "greater than," or "greater than or equal to" precedes the first numerical value in a series of two or more numerical values, the term "at least," "greater than" or "greater than or equal to" applies to each of the numerical values in that series of numerical values. For example, greater than or equal to 1, 2, or 3 is equivalent to greater than or equal to 1, greater than or equal to 2, or greater than or equal to 3.

Wherever the term "no more than," "less than," or "less than or equal to" precedes the first numerical value in a series of two or more numerical values, the term "no more than," "less than" or "less than or equal to" applies to each of the numerical values in that series of numerical values. For example, less than or equal to 1, 2, or 3 is equivalent to less than or equal to 1, less than or equal to 2, or less than or equal to 3.

Gas Rotor Loader Cell Apparatus

The present disclosure pertains to an apparatus and method the gas rotor loader cell described herein. The novel device addresses several conditions encountered by traditional gas devices as enumerated herein. As such, in an embodiment, gas rotor loader cell apparatus may be configured to allow for efficient use of an isotopic enriched label gas. In this manner, the second most expensive component of the gas rotor loader cell apparatus may be at least one labeled gases which may be used to provide a detectable signal in the NMR spectrometer. In traditional systems, as known in the art, most of the gas is wasted by filling the void space in the glass cell and vacuum fittings before reaching the sample that resides in a minuscule rotor (e.g., 1 cm height×1.9 mm O.D. volume=10 µL). As such, in this embodiment, the gas loader cell of the gas rotor loader cell apparatus may be miniaturized, which correspondingly miniaturizes the void volumes, such that the amount of expensive isotopically labeled gas used is significantly decreased, as compared to the conventional glass rotor loader design and/or connecting equipment, thereby optimizing efficiency during testing and/or resolving the issue of wasted gas during testing.

As stated above, in an embodiment, the gas rotor loader cell apparatus, described herein, comprising a miniaturized gas loader cell may be the first step in miniaturizing the entire system. As known in the art, current glass rotor loader gas devices that are used for loading gases to an NMR rotor are generally connected to at least one conventional Schlenk (e.g., vacuum) line anchored in a specific location in the lab, such that valuable laboratory space is permanently occupied by the device. Accordingly, the portability of the entire system is difficult as one would need to transport the entire system, including the at least one Schlenk line, to a remote data location. Alternatively, while at least one alternative Schlenk line may be produced at the remote location, this will increase the cost.

Moreover, as known in the art, existing NMR gas rotor designs work on one size rotor such that the entire cell glassware of different size rotors is required to be replicated, making such prior art designs expensive and/or challenging to design. Accordingly, in an embodiment, the gas rotor loader cell apparatus, described herein, may be configured to be compatible with at least one rotor at a first predetermined size and/or at least one alternative rotor at a second predetermined size, such that the gas rotor loader cell apparatus may be configured to provide more flexibility at a substantially reduced price.

Additionally, in an embodiment, the gas rotor loader cell apparatus may allow for at least one device to be connected-in-series to the at least one vacuum (e.g., Schlenk) and/or a gas supply, such that at least one sample may be configured to be activated and/or the at least one gas loaded at once to improve throughput. In this manner, in this embodiment, the gas rotor loader cell apparatus may also be configured to provide ease of use with at least one Valve "V" used to open and/or close the at least one vacuum line, and/or at least one Valve "G" used to allow the gas to enter the cell. Accordingly, the gas rotor loader cell apparatus may comprise a metal, plastic, and/or any material known in the art which may allow for loading of at least one gas at different temperatures.

Figure 1B:
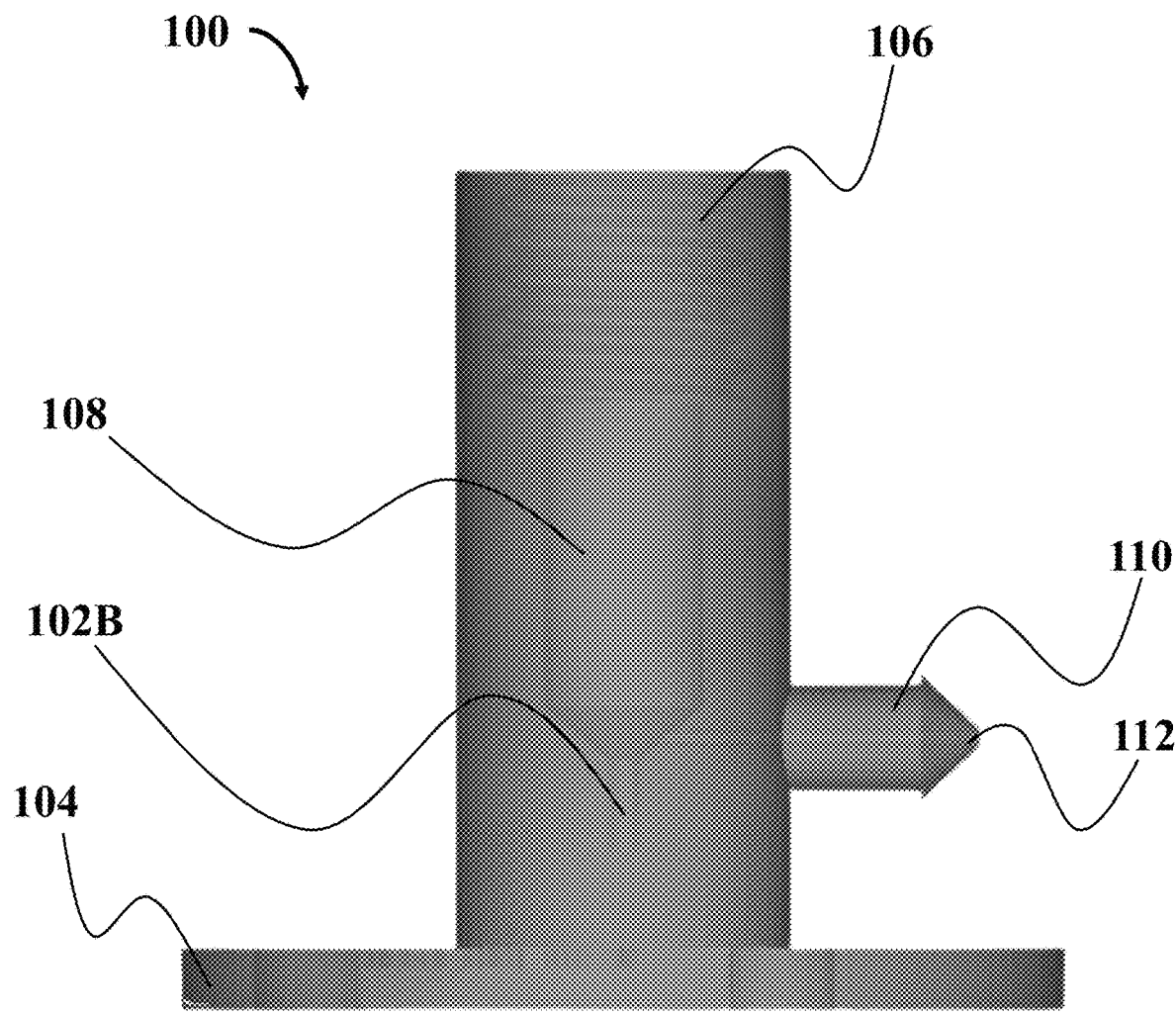
Figure 2:
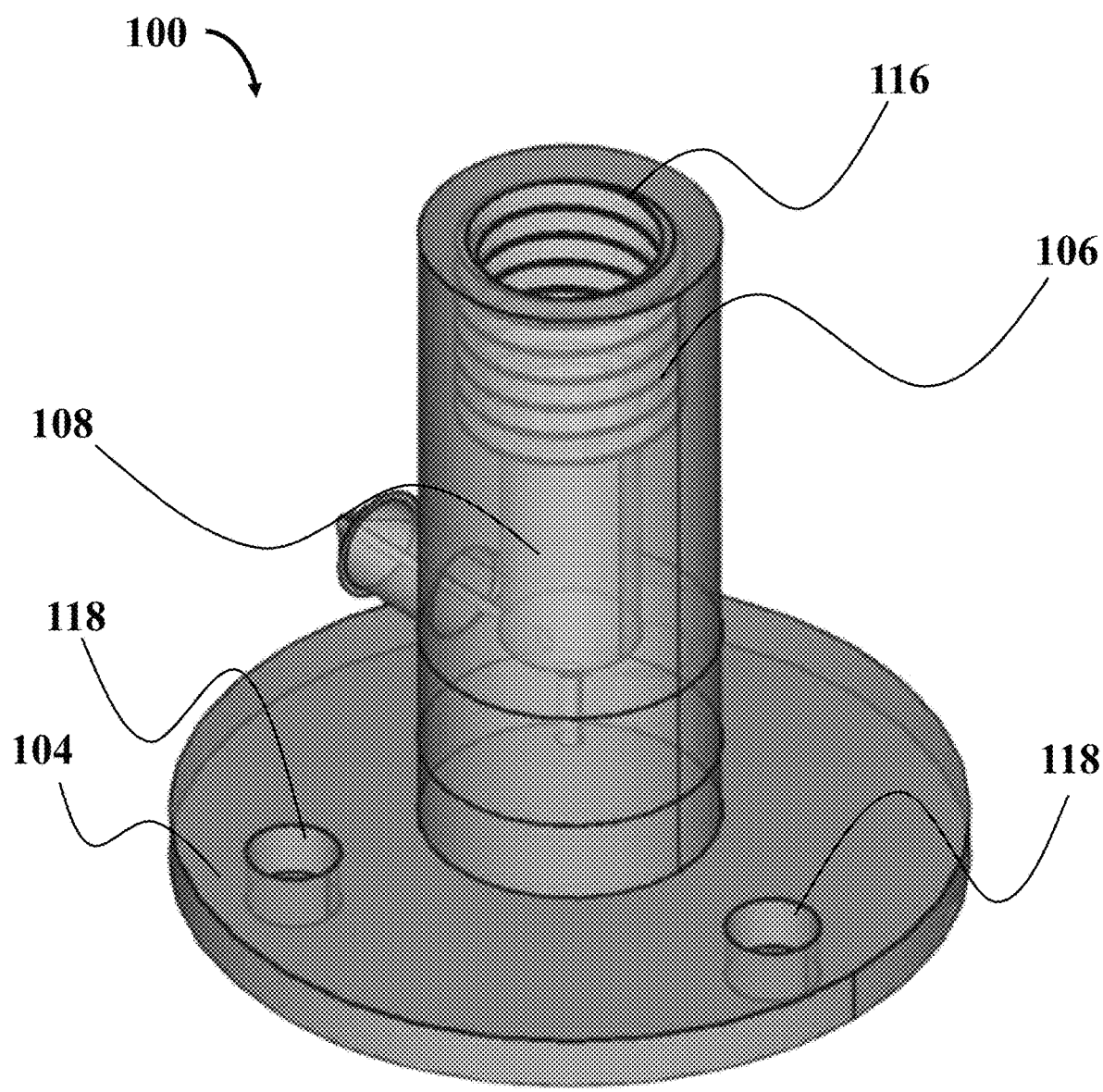
FIG. 2 is a perspective top view of a gas rotor loader cell, according to an embodiment of the present disclosure.

FIGS. 1A-1B, in conjunction with FIGS. 2-5, depict the gas rotor loader cell apparatus, according to an embodiment of the present disclosure. In this embodiment, the gas rotor loader cell apparatus may comprise at least one parts: (1) a base 100; and (2) a plunger 200. As such, base 100 may be configured to retain at least one rotor that has been filled with at least one sample. Additionally, in this embodiment, base 100 may be generally comprised of a base having an outer cylinder extending from a mounting plate 104. Additionally, as shown in FIG. 2, in this embodiment, mounting plate 104 of base 100 may comprise at least one mounting aperture 118 configured to extend between a top surface of mounting plate 104 and a bottom surface of mounting plate 104, such that at least one attachment component may be configured to enter the at least one mounting aperture 118 to allow mounting platform 104 of the gas rotor loading cell apparatus to be temporarily fixed to at least one ground platform.

Figure 3:
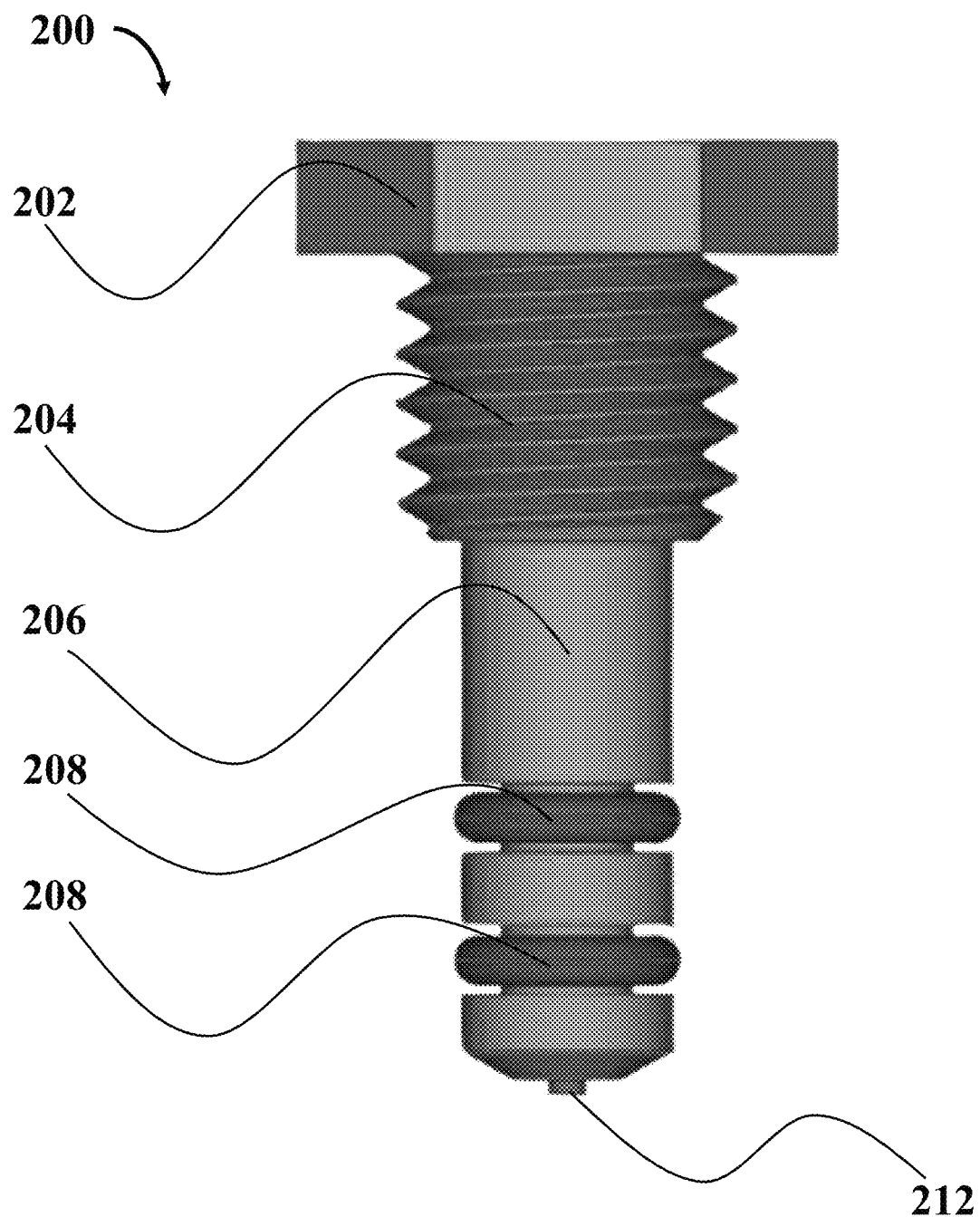
FIG. 3 is a side view of a plunger of for a rotor of a gas rotor loader cell, according to an embodiment of the present disclosure.

Furthermore, as shown in FIGS. 1A-2, in conjunction with FIG. 3, in an embodiment, a holding cylinder may be disposed within the outer cylinder of base 100. As such, in this embodiment, the holding cylinder may comprise a bottom frustoconical shaped section having an opening at the distal end sized to hold a rotor (e.g., conical funnel 114). In addition, proximal to conical funnel 114, the holding cylinder may comprise at least one smooth section 108 sized to allow for plunger 200 to create an airtight seal when plunger 200 contacts an inner wall of the at least one smooth section 108 of the holding cylinder. Moreover, in this embodiment, proximal to the at least one smooth section 108, the holding cylinder may comprise a female coupling mechanism 106 complimentary to a male coupling mechanism 204 of plunger 200, such that when plunger 200 enters a holding aperture 116 of the holding cylinder of base 100, the female coupling mechanism 106 and male coupling mechanism 204 may be configured to temporarily couple plunger 200 to base 100. As such, in some embodiments, female coupling mechanism 106 may comprise a screw-threaded engagement, a single contact bayonet cap, a double contact bayonet cap, an Edison Screw, a lilliput Edison Screw, a miniature Edison Screw, a Candelabra Edison Screw, a giant Edison screw, a halogen adaptor, a female peg, and/or any female coupling device known in the art.

In addition, in an embodiment, the outer cylinder may comprise a hose barb 110 extending laterally from the outer cylinder. In this manner, hose barb 110 may comprise at least one barb aperture 112 configured to extend between the inner wall of the holding cylinder and an outer surface of hose barb 110, such that the gas rotor loader cell apparatus may be connected to the least one valve which connects to the at least one vacuum pump and the at least one isotopically labeled gas.

Figure 4:
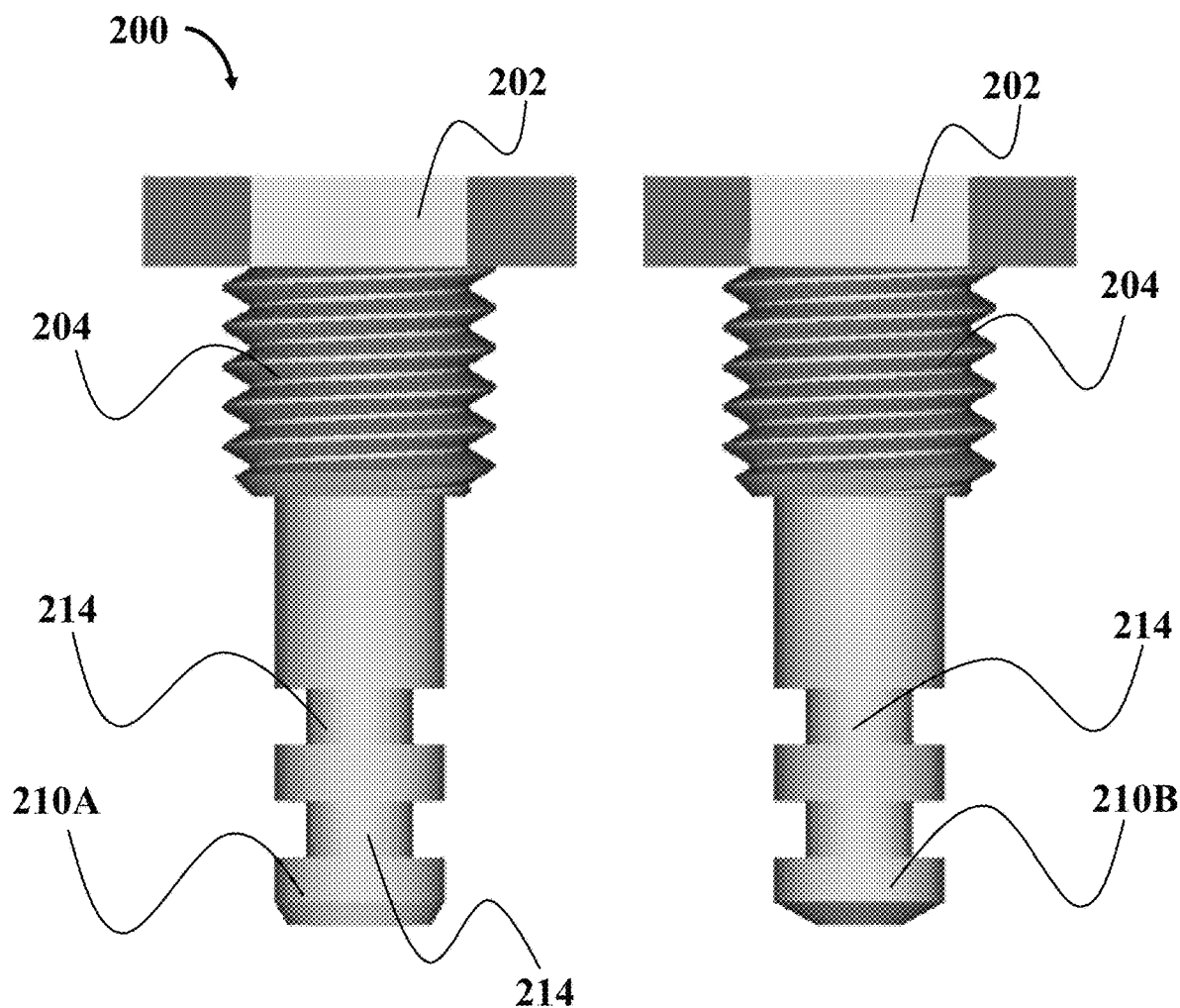
FIG. 4 is a side view of a first plunger and a second plunger for a rotor of a gas rotor loader cell apparatus, according to an embodiment of the present disclosure.
Figure 5:
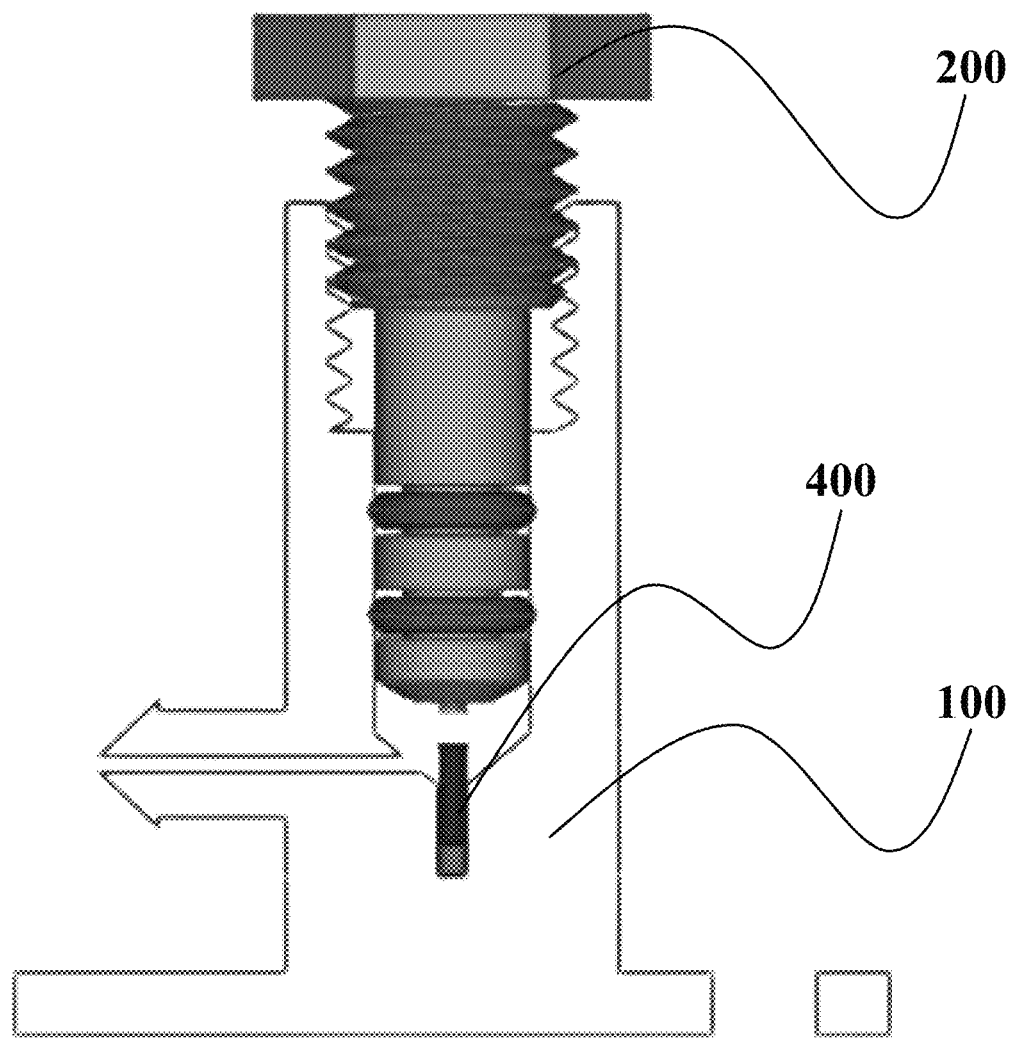
FIG. 5 is a side view showing an insertion of a rotor's top end cap on a plunger of a gas rotor loader cell apparatus, where the outline comprises a center cross-section of a base of a gas rotor loader cell apparatus, according to an embodiment of the present disclosure.

FIG. 3, in conjunction with FIG. 4 and FIG. 5, depicts plunger 200 of the gas rotor loader cell apparatus, according to an embodiment of the present disclosure. Accordingly, in this embodiment, plunger 200 may comprise at least three functions, including but not limited to: (1) holding a rotor end cap 212; (2) forming an airtight seal with the inner wall of the at least one smooth section 108 of base 100 to prevent air from entering or gas from leaving an inner chamber of the gas rotor loader cell apparatus; and (3) allowing at least one operator to push rotor end cap 212 into the top of the rotor 400.

As shown in FIG. 3, in conjunction with FIG. 4 and FIG. 5, in an embodiment, the plunger has four sections: a frustoconical end 210A and/or 210B; a smooth section 206; a threaded section 204; and a handle 202, all of which are provided with more detail below. Accordingly, as shown in FIGS. 3-5, in an embodiment, the distal portion of plunger 200 comprises frustoconical end 210A, 210B, such that frustoconical end 210A, 210B may be configured to complimentary match conical funnel 114 of the holding cylinder of base 100 to allow for insertion of plunger 200 into the holding cylinder of base 100. Moreover, in this embodiment, frustoconical end 210A, 210B may be configured to hold rotor end cap 212. In this manner, in some embodiments, the frustoconical end 210A, 210B may be filled with silicone and/or any material known in the art with silicone-like properties. In this manner, as shown in FIG. 4, in conjunction with FIGS. 1A-3 and FIG. 5, in an embodiment, frustoconical end 210A, 210B may be filled such that frustoconical end 210A, 210B may conform and be complementary any rotor end cap 212 and/or rotor 400 known in the art (e.g., rotor 400 and/or rotor end cap 212 having a size of 1.9 mm, 1.3 mm and/or 0.7 mm.)

Additionally, in an embodiment, frustoconical end 210A, 210B of plunger 200 may be configured to hold the rotor end cap 212 in a space above rotor 400 and against gravity. As such, as shown in FIG. 3, in conjunction with FIG. 5, in this embodiment, a high amount of friction between frustoconical end 210A, 210B and rotor end cap 212 may allow for the rotor end cap 212 to be held in a predetermined position to allow the at least one operator to perform testing for a predetermined amount of time once the at least one operator pushes the rotor end cap 212 into the top of rotor 400.

Moreover, as shown in FIGS. 3-4, in an embodiment, smooth section 206 of plunger 200 may be configured to be disposed proximal to frustoconical end 210A, 210B. In this manner, in this embodiment, smooth section 206 may comprise at least one groove 214, such that the at least one groove 214 may be configured to hold at least one O-ring 208. As such, in an embodiment, upon insertion of plunger 200 into the holding cylinder of base 100, the at least one O-ring 208, and in some embodiments along with vacuum grease, form the airtight seal with the inner wall of the holding cylinder of base 100 to prevent air from entering and/or the gas from escaping. In some embodiments, plunger 200 may comprise at least two grooves. For example, in these other embodiments, the at least two grooves may be configured to hold a #8 O-ring, as shown in FIG. 3.

Furthermore, in an embodiment, as shown in FIGS. 3-5, plunger 200 may comprise male coupling mechanism 204 configured to be complimentary to female coupling mechanism 106 of base 100, such that when plunger 200 enters a holding aperture 116 of the holding cylinder of base 100, the male coupling mechanism 204 and female coupling mechanism 106 may be configured to temporarily couple plunger 200 to base 100. As such, in some embodiments, male coupling mechanism 204 may comprise a screw-threaded engagement, a single contact bayonet cap, a double contact bayonet cap, an Edison Screw, a lilliput Edison Screw, a miniature Edison Screw, a Candelabra Edison Screw, a giant Edison screw, a halogen adaptor, a male peg, and/or any male device known in the art. In this manner, the male coupling mechanism 204 may be disposed proximal to smooth section 206 of plunger 200. In this manner, as shown in FIG. 5, in conjunction with FIGS. 1A-4, male coupling mechanism 204 of plunger 200 may be configured to allow the at least one operator to temporarily couple plunger 200 to base 100, via holding aperture 116 of the holding cylinder of base 100, thereby inserting rotor end cap 212 into the distal opening of frustoconical end 210A, 210B of plunger 200, such that rotor end cap 212 may be pushed into the top of rotor 400. Finally, in this embodiment, a handle 202 may be positioned proximal to male coupling mechanism 204 of plunger 200 to allow the at least one operator to readily grip plunger 200 of the gas rotor loading cell apparatus. As such, while handle 202 may be formed in any shape known in the art, in some embodiments, handle 202 of plunger 200 may be configured to be hexagonal in shape.

Figure 6:
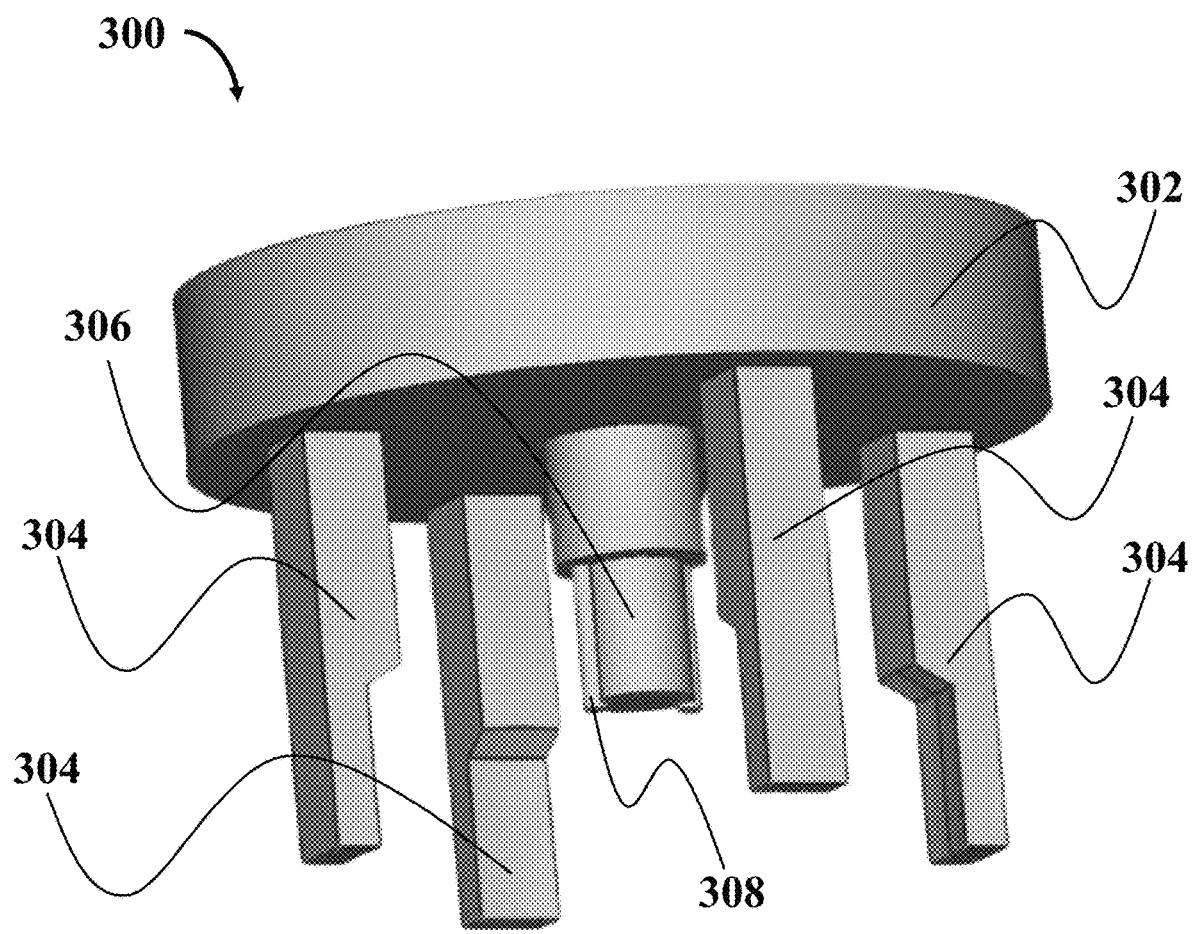
FIG. 6 is a side view of a silicone mold forming tool for the rotor of FIGS. 1A-1B, according to an embodiment of the present disclosure.
Figure 7:
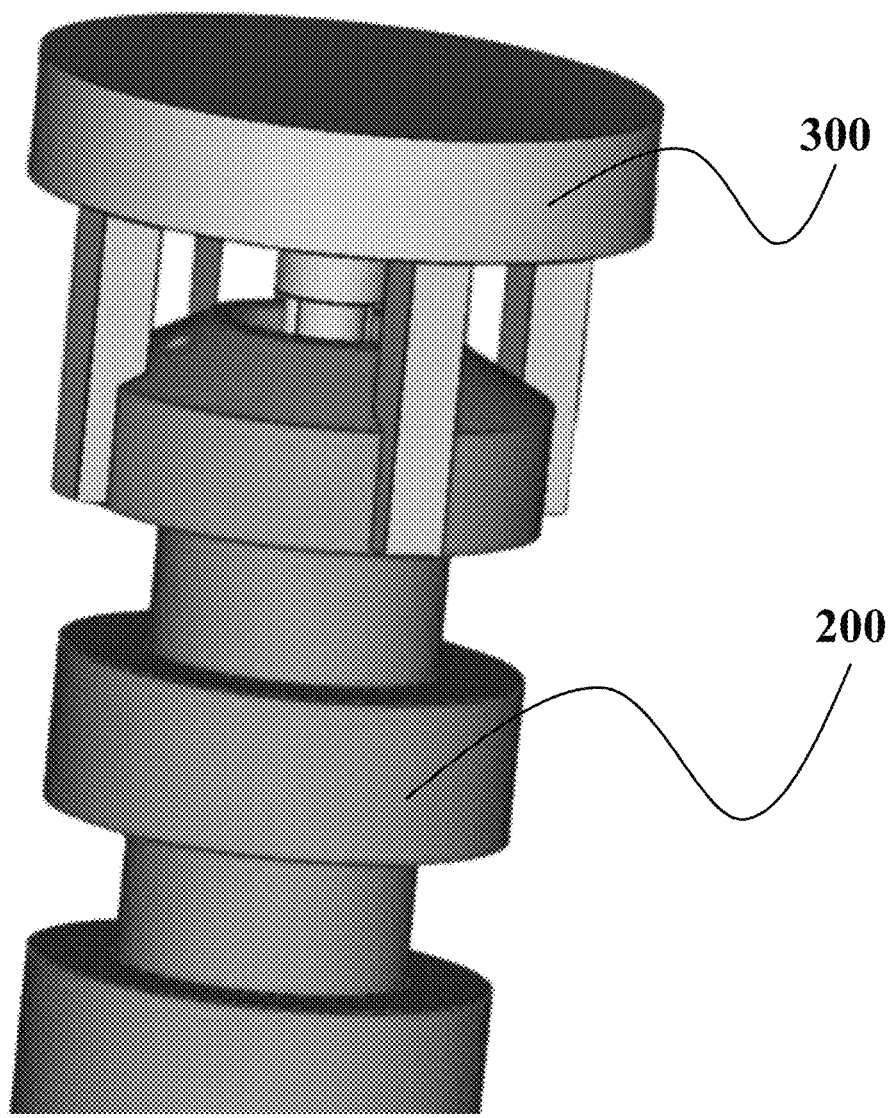
FIG. 7 is a side view of the silicone molding tool connected to a device plunger for a gas loader cell, according to an embodiment of the present disclosure.

Furthermore, as shown in FIG. 3, in conjunction with FIG. 6 and FIG. 7, in an embodiment, frustoconical end 210A, 210B of plunger 200 may be configured to be hollow so that it can be filled with silicone and/or any material known in the art comprising silicone-like properties. As such, in this embodiment, the material (e.g., silicone) must be configured to be molded so that rotor end cap 212 (1) may fit within in the mold; (2) rotor end cap 212 may be held in place with at least a frictional force; (3) a cavity of frustoconical end 210A, 210B may be aligned to the center of plunger 200; and (4) a pocket of air may be inhibited from forming between a top side of the rotor cap end 212 and a bottom side of the molded frustoconical end 210A, 210B. In this manner, as shown in FIG. 6 and FIG. 7, a forming tool 300 may be configured to mold the pre-cured material to meet the above requirements.

As stated above, in use, in some embodiments, frustoconical end 210A, 210B of plunger 200 may be filled with silicone (e.g., Sylgard 184). Subsequently, forming tool 300 may then be placed on top of plunger 200 so that at least one portion of forming tool 300 may be configured to enter the pre-cured silicone. After the silicone is cured, the tool is removed.

In this manner, as shown in FIGS. 6-7, in an embodiment, forming tool 300 may be configured to create a cavity in the material of frustoconical end 210A, 210B of plunger 200, such that the cavity may be specifically sized to hold the rotor end cap 212 for rotor 400 (e.g., rotor 400 and/or rotor end cap 212 having a size of 1.9 mm, 1.3 mm and/or 0.7 mm.) In this embodiment, forming tool 300 may comprised a circular base 302 having at least one projections 304 extending distally therefrom, such that the at least one projection 304 may be configured to attach to at least one outer wall of frustoconical end 210A, 210B of plunger 200. In addition, a center mold 306, shaped to complimentary correspond to the shape of the rotor end cap 212, may extend distally from the center of circular base 302. Moreover, in an embodiment, center mold 306 may be sized to be slightly undersized for rotor end cap 212 to ensure there is enough friction provided by frustoconical end 210A, 210B of plunger 200 to hold rotor end cap 212 against gravity. Additionally, at least one gutter 308, configured to be disposed on at least one side of center mold 306, may be positioned on at least a portion of forming tool 300, that, while during the molding process, the at least one gutter 308 may create at least one divot within frustoconical end 210A, 210B of plunger 200, such that that air behind rotor end cap 212 is allowed to escape. As such, the removal of air behind rotor end cap 212 may be critical because if a pocket of air is between the material of molded frustoconical end 210A, 210B of plunger 200 and rotor end cap 212, the air may expand under vacuum and push rotor end cap 212 out of position.

As such, in some embodiments, base 100 and plunger 200 may be created via at least one fabricating device, such that the fabricating device may comprise any device known in the art to produce a mold from silicone and/or any material known in the art comprising silicone-like properties. In addition, due to the shape and/or the specific geometry, forming tool 300 may be formed by at least one fabricating device. In some embodiments, the base 100, the plunger 200, and/or the forming tool 300 may be comprised of and/or manufacturing using at least one material comprising strong transparent acrylic and/or polycarbonate (e.g., Shapeways' Accura 60). However, in some embodiments, the base 100, the plunger 200, and/or the forming tool 300 may comprise of any material known in the art comprising acrylic-like properties and/or polycarbonate-like properties, including but not limited to metals such as aluminum and copper.

Method of Use

Figure 8:
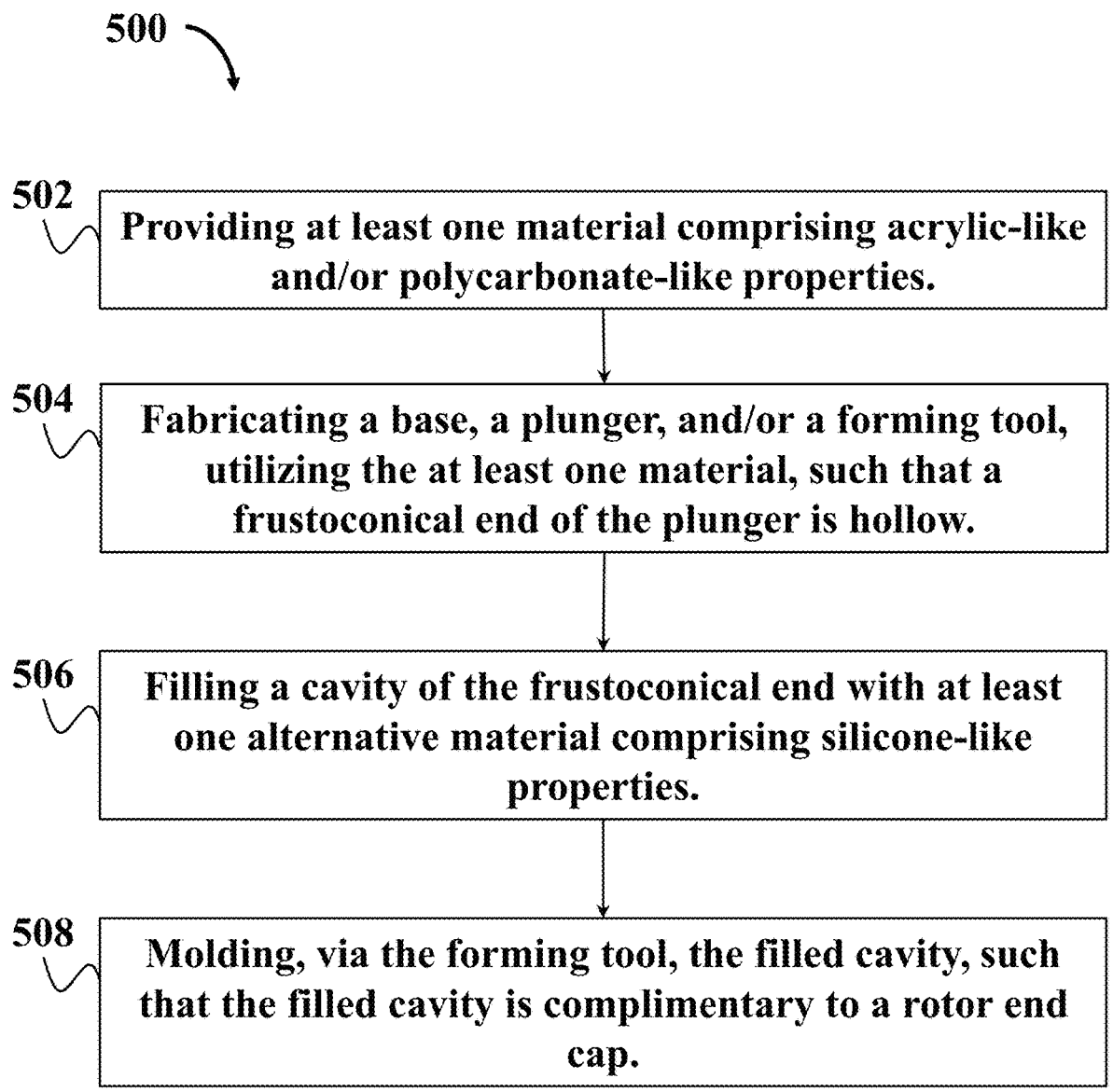
FIG. 8 is a flow chart providing the steps of a method of manufacturing the gas rotor loader cell apparatus comprising a base, a plunger, and/or a forming tool, according to an embodiment of the present disclosure.

FIG. 8, in conjunction with FIGS. 1-7, depicts a flow chart providing the steps of a method 500 of manufacturing the gas rotor loader cell apparatus comprising base 100, plunger 200, and/or forming tool 300, according to an embodiment of the present disclosure. The steps delineated in FIG. 8 are merely exemplary of an order of manufacturing the gas rotor loader cell apparatus. The steps may be carried out in another order, with or without additional steps included therein.

As shown in FIG. 8, in conjunction with FIGS. 1-7, in an embodiment, the method 500 begins at step 502, in which at least one material comprising acrylic-like and/or polycarbonate-like properties is provided. As such, in this embodiment, the at least one material may comprise transparent characteristics. The next step, step 504, comprises fabricating base 100, plunger 200, and/or forming tool 300, utilizing the at least one material, such that frustoconical end 210A, 210B of plunger 200 may be hollow, thereby creating at least one cavity in frustoconical end 210A, 210B of plunger 200. Additionally, in this embodiment, base 100, plunger 200, and/or forming tool 300 may be fabricated, via a computing device comprising at least one processor, such that the computing device may be in electrical communication with at least one fabricating device. In this manner, the design of base 100, plunger 200, and/or forming tool 300 may be completed using at least one computer program (e.g., CAD), such that the processor may be configured to activate the at least one fabricating device to create base 100, plunger 200, and/or forming tool 300 based on the computer program design. Subsequently, at step 506, in an embodiment, the cavity of frustoconical end 210A, 210B of plunger 200 may be filled with at least one alternative material comprising silicone-like properties. In some embodiments, the at least one alternative material may be pre-cured. Finally, at step 508, in this embodiment, the filled cavity of frustoconical end 210A, 210B of plunger 200 may be molded, via forming tool 300, such that the filled cavity may be shaped complimentary to rotor end cap 212, thereby preventing gravitational slippage, via at least one frictional force between frustoconical end 210A, 210B of plunger 200 and rotor end cap 212.

Figure 9:
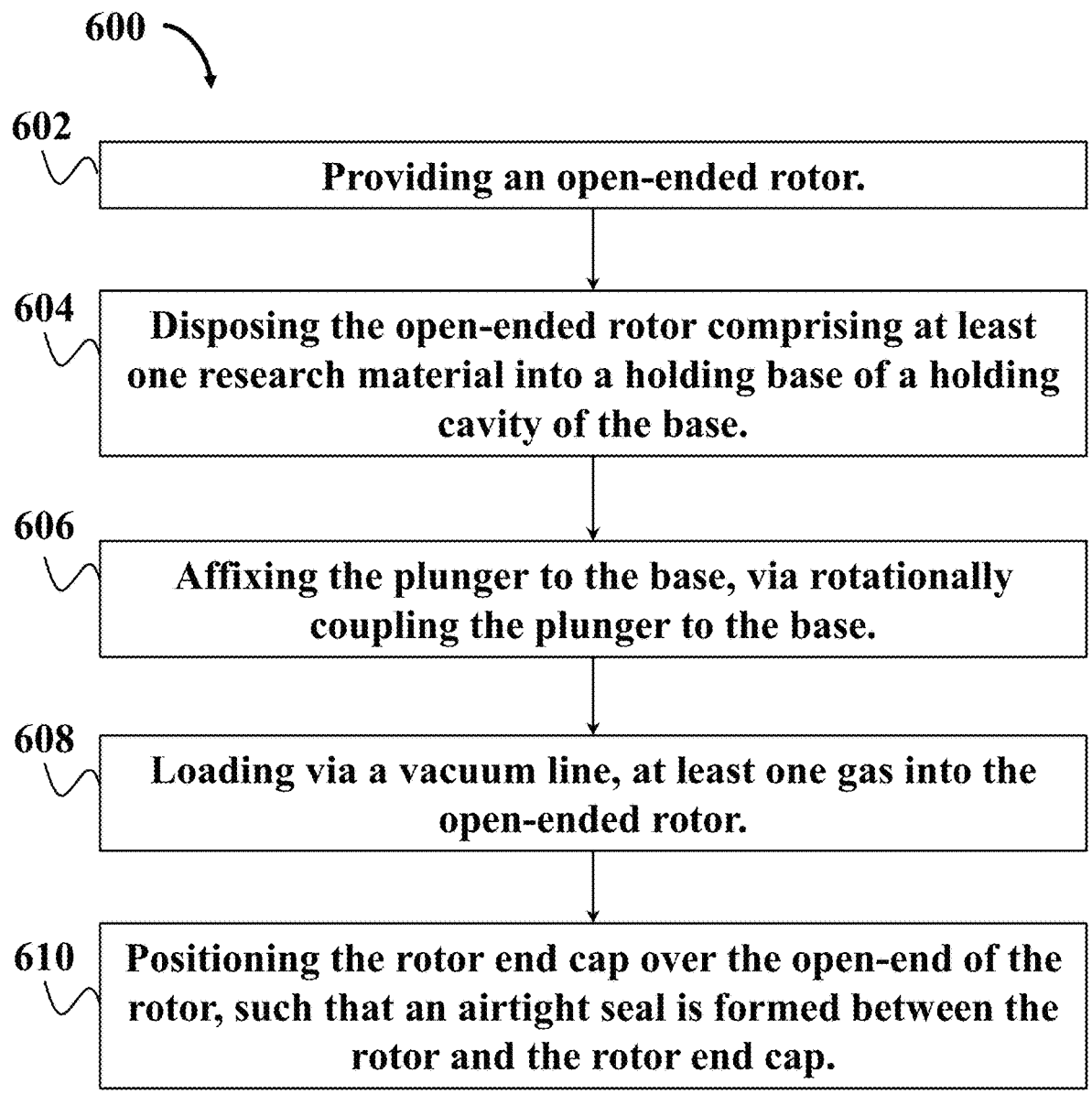
FIG. 9 is a flow chart providing the steps of a method of performing an ssMAS experiment, utilizing a gas rotor loader cell apparatus, according to an embodiment of the present disclosure.

FIG. 9, in conjunction with FIGS. 1-7, depicts a flow chart providing the steps of a method 600 of performing an ssMAS experiment, utilizing the gas rotor loader cell apparatus, according to an embodiment of the present disclosure. The steps delineated in FIG. 9 are merely exemplary of an order of performing an ssMAS experiment, utilizing the gas rotor loader cell apparatus. The steps may be carried out in another order, with or without additional steps included therein.

As shown in FIG. 9, in conjunction with FIGS. 1-7, in an embodiment, the method 600 begins at step 20602, in which rotor 400 comprising an open-end is provided, such that at least one research material (e.g., POPs, MOF, CUF, etc.) may be disposed within rotor 400. The next step, step 604, comprises disposing open-ended rotor 400 comprising the at least one research material into a holding base of the holding cavity of the holding cylinder of base 100. Additionally, in this embodiment, the at least one research material may be configured to absorb at least one gas at its maximum capacity when activated (e.g., water and solvent depleted by vacuum and/or heat). Subsequently, at step 606, plunger 200 may be interconnected with base 100, via rotationally coupling plunger 200 to base 100, such that male coupling mechanism of plunger 200 and female coupling mechanism of base 100 are temporarily affixed. Moreover, in this embodiment, when plunger 200 is interconnected with base 100, an airtight seal may be formed within the holding cylinder of base 100. Furthermore, at step 608, at least one gas may be loaded into the holding cylinder of base 100, via a vacuum line in mechanical communication with at least one barb aperture 112 of base 100. In this manner, the at least one gas may be disposed within the open-ended rotor. Moreover, in some embodiments, the at least one gas may be greater than or equal to 1 atm, based on the characteristics of rotor 400 and/or the at least one research material. Finally, at step 610, the rotor end cap 212 may be positioned over the open-end of rotor 400, such that an air-tight seal may be formed, trapping the at least one loaded gas within rotor 400 with the at least one research material. Accordingly, In some embodiments, the miniaturization of the gas loading cell may decrease the amount of expensive isotopically labeled gas used by minimizing the void volumes present in the conventional glass rotor loader design and connecting equipment.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

It is also to be understood that the following claims are intended to cover all of the generic and specific features of the invention herein described, and all statements of the scope of the invention which, as a matter of language, might be said to fall therebetween.

What is claimed is:

1. A gas rotor loader cell apparatus comprising:
   a base, the base comprising:

a mounting plate;
an outer cylinder extending proximally from the mounting plate;
a hose barb extending laterally from the outer cylinder; and
a holding cylinder disposed within the outer cylinder, the holding cylinder comprising:
a female coupling mechanism; and
a smooth section extending distally from the female coupling mechanism and terminating in a conical funnel;
a plunger, the plunger comprising:
a proximal handle;
a male coupling mechanism extending distally from the handle;
a smooth section extending distally from the threaded section;
at least one groove disposed about at least a portion of the smooth section, wherein at least one O-ring is configured to be disposed in the at least one groove; and
a frustoconical end extending distally from the smooth section; and
wherein the plunger is sized for seamless insertion into the holding cylinder of the base.

2. The gas rotor loader cell apparatus of claim 1, wherein the apparatus is formed from a transparent material comprising acrylic-like properties, polycarbonate-like properties, or both.

3. The gas rotor loader cell apparatus of claim 1, wherein the frustoconical end is hollow, whereby the frustoconical end comprises at least one cavity.

4. The gas rotor loader cell apparatus of claim 3, wherein the at least one cavity of the frustoconical end is filled with at least one material comprising silicone-like properties.

5. The gas rotor loader cell apparatus of claim 3, wherein the at least one cavity is disposed in a distal end of the frustoconical end, whereby the frustoconical end is configured to hold a rotor end cap.

6. The gas rotor loader cell apparatus of claim 5, wherein the male coupling mechanism of the plunger is configured to couple to the female coupling mechanism of the base.

7. The gas rotor loader cell apparatus of claim 6, wherein when the male coupling mechanism of the plunger is temporarily affixed to the female coupling mechanism of the base, the at least one O-ring of the plunger is configured to abut an inner wall of the holding cylinder, thereby forming an airtight seal between the inner wall of the holding cylinder and the at least one O-ring.

8. The gas rotor loader cell apparatus of claim 7, wherein the hose barb comprises at least one hose barb aperture extending between the inner wall of the holding cylinder and an outer surface of the hose barb.

9. The gas rotor loader cell apparatus of claim 8, wherein the hose barb is configured to temporarily affix to a vacuum line, whereby at least one gas is transmitted from the vacuum line and disposed within the holding cylinder of the base, via the at least one hose barb aperture.

10. The gas rotor loader cell apparatus of claim 9, wherein a rotor is disposed about a base of the holding cylinder, whereby a top surface of the rotor is open-ended.

11. The gas rotor loader cell apparatus of claim 10, wherein when the male coupling mechanism of the plunger is temporarily affixed to the female coupling mechanism of the base, the rotor end cap is configured to temporarily abut seamlessly with the top surface of the rotor, thereby retaining at least a portion of the at least one gas within the rotor.

12. A method of manufacturing a gas loader cell apparatus, the method comprising:
providing at least one material, the at least one material comprising at acrylic-like properties, polycarbonate-like properties, or both;
fabricating, via a computer device comprising at least one processor in electrical communication with at least one fabricating device, a base, a plunger, and a fabricating tool, wherein a distal end of a frustoconical end of the plunger comprises at least one cavity;
disposing at least one alternative material comprising silicone-like properties into the at least one cavity of the frustoconical end of the plunge; and
molding, via the forming tool, the filled cavity, wherein the filled cavity is complimentary to a rotor end cap, whereby the frustoconical end is configured to hold the rotor end cap.

13. The method of claim 12, wherein the at least one fabricating device comprises at least one 3D printer.

14. The method of claim 12, wherein the at least one material comprising silicone-like properties is pre-cured.

15. The method of claim 12, wherein the method further comprises the step of:
creating, via a design software, at least one design of the base, the plunger, and the forming tool compatible to the at least one fabricating device, wherein the processor is configured to transmit the at least one design to the at least one fabricating device.

16. The method of claim 15, wherein the method further comprises the step of:
attaching the forming tool to the frustoconical end of the plunger, wherein the forming tool comprises at least one projection extending distally from a circular base, whereby the at least one projection is configured to attach to at least one outer wall of the frustoconical end of the plunger.

17. The method of claim 16, wherein the method further comprises the step of:
disposing the rotor end cap on a molded distal side of the frustoconical end of the plunger, wherein the molded distal end of the frustoconical end and the rotor end cap comprise a coefficient of friction greater than gravity.

18. A gas rotor loader cell system for ssMAS experiments, the gas rotor loader cell system comprising:
a base, the base comprising:
a mounting plate;
an outer cylinder extending proximally from the mounting plate;
a hose barb extending laterally from the outer cylinder; and
a holding cylinder disposed within the outer cylinder, the holding cylinder comprising:
a female coupling mechanism; and
a smooth section extending distally from the female coupling mechanism and terminating in a conical funnel;
a plunger, the plunger comprising:
a proximal handle;
a male coupling mechanism extending distally from the handle;
a smooth section extending distally from the threaded section;
at least one groove disposed about at least a portion of the smooth section, wherein at least one O-ring is configured to be disposed in the at least one groove; and a frustoconical end extending distally from the smooth section;

a forming tool, the forming tool comprising:
   a circular base;
   at least one projection, wherein the at least one projection extends distally from the circular base;
   a center mold; and
   at least one gutter; and wherein the plunger is sized for seamless insertion into the holding cylinder of the base.

19. The gas rotor loader cell system of claim 18, wherein the center mold is shaped complimentary to a shape of a rotor end cap.

20. The gas rotor loader cell system of claim 19, wherein the at least one gutter is configured to be disposed on at least one side of the center mold, whereby the at least one gutter is positioned on at least a portion of the forming tool, such that the at least one gutter is configured to form at least one divot within an outer surface of the frustoconical end of the plunger.

* * * * *